United States Patent
Wang et al.

(10) Patent No.: US 11,967,386 B2
(45) Date of Patent: Apr. 23, 2024

(54) MEMORY SUB-SYSTEM FOR MEMORY CELL TOUCH-UP

(71) Applicant: Micron Technology, Inc., Boise, ID (US)

(72) Inventors: Bin Wang, Boise, ID (US); Pitamber Shukla, Boise, ID (US); Scott A. Stoller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/747,761

(22) Filed: May 18, 2022

(65) Prior Publication Data

US 2023/0377664 A1    Nov. 23, 2023

(51) Int. Cl.
  *G11C 11/34*  (2006.01)
  *G11C 16/10*  (2006.01)
  *G11C 16/34*  (2006.01)

(52) U.S. Cl.
  CPC ........ *G11C 16/3459* (2013.01); *G11C 16/102* (2013.01)

(58) Field of Classification Search
  CPC ............ G11C 16/3459; G11C 16/102
  USPC ....................................... 365/185.22
  See application file for complete search history.

(56) References Cited

U.S. PATENT DOCUMENTS

| | | | | |
|---|---|---|---|---|
| 5,768,193 A * | 6/1998 | Lee | ........ | G11C 16/3418 365/185.12 |
| 7,583,536 B2 * | 9/2009 | Lioka | ........ | G11C 16/105 365/185.24 |
| 7,729,177 B2 * | 6/2010 | Song | ........ | G11C 16/26 365/185.08 |
| 8,194,460 B2 * | 6/2012 | Moschiano | ........ | G11C 16/3454 365/185.17 |
| 9,530,492 B2 * | 12/2016 | Lee | ........ | G11C 11/56 |
| 9,613,704 B2 * | 4/2017 | Lee | ........ | G11C 16/0483 |
| 9,875,805 B2 * | 1/2018 | Tseng | ........ | G11C 16/3459 |
| 10,720,215 B2 * | 7/2020 | Hsu | ........ | G11C 16/10 |
| 11,574,691 B2 * | 2/2023 | Cho | ........ | G11C 16/30 |
| 2014/0231954 A1 | 8/2014 | Lue | | |
| 2016/0179386 A1 | 6/2016 | Zhang | | |

FOREIGN PATENT DOCUMENTS

| | | | |
|---|---|---|---|
| CN | 101086897 A | * 12/2007 | ........ G11C 11/5628 |
| WO | 2017074570 A1 | 5/2017 | |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

*Primary Examiner* — Viet Q Nguyen
(74) *Attorney, Agent, or Firm* — Brooks, Cameron & Huebsch, PLLC

(57) ABSTRACT

An apparatus can include a touch-up component. The touch-up component can detect that at least one memory cell of a page of memory cells has lost a portion of a charge. The touch-up component can set touch-up parameters for the page of memory cells. The touch-up component can cause a transfer of data from the page of memory cells to a cache. The touch-up component can reprogram the at least one memory cell using the set touch-up parameters.

23 Claims, 7 Drawing Sheets

MEMORY SUB-SYSTEM FOR MEMORY CELL TOUCH-UP

TECHNICAL FIELD

Embodiments of the disclosure relate generally to memory sub-systems, and more specifically, relate to memory sub-system for memory cell touch-up.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
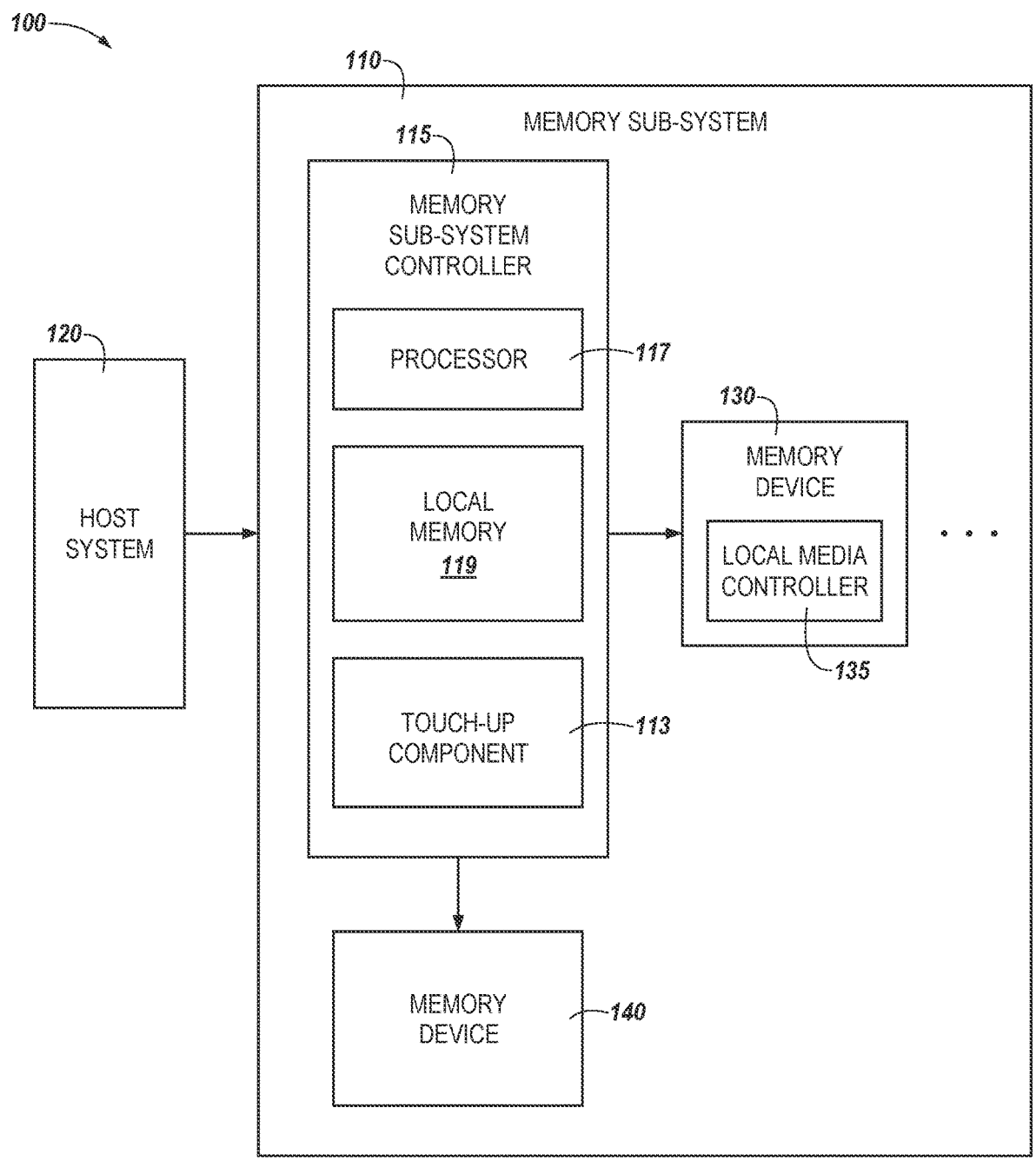
FIG. 1 illustrates an example computing system that includes a memory sub-system in accordance with some embodiments of the present disclosure.

Aspects of the present disclosure are directed to touch-up operations for memory cells associated with a memory sub-system, in particular to memory sub-systems that include a touch-up component. A memory sub-system can be a storage device, a memory module, or a hybrid of a storage device and memory module. An example of a memory sub-system is a storage system, such as a solid state drive (SSD). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

A memory device can be a non-volatile memory device. One example of non-volatile memory devices is a Not-AND (NAND) memory device (also known as flash memory).

Other examples of non-volatile memory devices are described below in conjunction with FIG. 1. A non-volatile memory device is a package of one or more die. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can be written to in order to store one or more bits of binary information and has various logic states that correlate to the number of bits being stored. The logic states can be represented by binary values, such as "0" and "1", or combinations of such values, where one bit representing those binary values is stored for single level cells (SLCs), two bits are stored per cell for multi-level cells (MLCs) (e.g., representing "00," "01," "10," and "11"), three bits are stored per cell for triple level cells (TLCs), four bits are stored per cell for quad-level cells (QLCs) and so forth. These various types of cells, (e.g., SLCs, MLCs, TLCs, QLCs), for example, can store one or more bits that each represent two logic states (e.g., representing program and erase states).

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Memory sub-systems can use cache blocks to write host data for improved performance. In some examples, the cache blocks for host data can be hybrid blocks. These hybrid blocks can be blocks that will be used in a single-level-cell (SLC), tri-level-cell (TLC), or quad-level-cell (QLC) mode. This can mean that although a particular block is currently being used as an SLC block, that it could also subsequently be used as a TLC or QLC block. When a host indicates to write further data, firmware of the memory sub-system can choose a free block (e.g., a block that hasn't been written to already or that doesn't contain data that needs to be maintained or saved). A number of factors can contribute to selecting the next block for writing data. These factors can include, for example, wear leveling rules, block availability, type of blocks, available idle times, program/erase counts (PECs), etc.

Data retention can contribute to reliability risks which can affect the ability of non-volatile memory (e.g., a NAND flash memory) to store correct data over a given period of time (e.g., due to a different data retention for particular time periods and particular temperatures used for different products). In one example, replacement gate technology can exhibit slow charge loss (SCL) and quick charge loss (QCL) phenomena which can seriously impact a read window budget (RWB) margin, ultimately resulting in data loss. In order to avoid such data loss, as described herein, memory cells with a voltage that is below a particular threshold voltage (e.g., below a program verify voltage) can be "touched up" or a program pulse can be performed to increase the voltage until it exceeds the corresponding program verify voltage. The proposed touch-up operation can include using a NAND copy back read and write operation to apply a same programmed pattern to reprogram the memory cells with charge loss (e.g., voltages below the program verify voltage).

By using this touch-up operation method, data transfer on a data bus (such as an ONFI bus) can be avoided in both the read and program directions. Further, additional overhead resources can be reduced by eliminating the use of the system controller to perform error correction. That is, some current solutions rely on a system background scan to detect charge loss that then triggers a background folding operation to refresh data to avoid data loss, which also triggers error correction operations to be performed on the data, using additional resources. Aspects of the present disclosure address the above and other deficiencies by using the touch-up operation to be implemented on a target page with charge loss directly as opposed to moving the data to a new location via single-level-cell (SLC)-to-SLC background folding, which triggers error correction and consumes other resources such as data bus bandwidth. This can improve overall system performance and endurance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes Not-AND (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3DNAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM),ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130, 140 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a touch-up component 113 that can be configured to orchestrate and/or perform operations to perform a touch-up operation and can use various components, data paths, and/or interfaces of the memory sub-system 110 to be enabled to do so. The touch-up component 113 can include various circuitry to facilitate minimizing an effect of charge loss and control the storage of data in the memory cells of the memory devices 130, 140. For example, the touch-up component 113 can include a special purpose circuitry in the form of an ASIC, FPGA, state machine, and/or other logic circuitry or software and/or firmware that can allow the touch-up component 113 to orchestrate and/or perform data storage operations related to programming memory cells that may have experienced a charge loss in order to protect data integrity and communicate to various components, data paths, and/or interfaces of the memory sub-system 110.

The touch-up component 113 can be communicatively coupled to the memory devices 130, 140 and can access the memory device 130, the memory device 140, internal data paths of the memory sub-system 110, and/or interfaces of the memory sub-system 110 to perform the operations described herein and/or to transfer storage data to additional elements of the memory sub-system 110.

In some embodiments, the memory sub-system controller 115 includes at least a portion of the touch-up component 113. For example, the memory sub-system controller 115 can include a processor 117 (processing device) configured to execute instructions stored in local memory 119 for performing the operations described herein. In some embodiments, the touch-up component 113 is part of the host system 110 (not illustrated), an application, or an operating system.

The memory devices 130, 140 in FIG. 1 can include a number of physical blocks in accordance with some embodiments of the present disclosure. For example, the memory devices 130, 140 can include a NAND flash memory array including the number of physical blocks. However, embodiments of the present disclosure are not limited to a particular type of memory or memory array. For example, the memory array can be a DRAM array, an RRAM array, or a PCRAM array, among other types of memory arrays. Further, the memory array can be located on a particular semiconductor die along with various peripheral circuitry associated with the operation thereof.

The memory cells of the memory array can be mixed mode cells operable as SLCs and/or XLCs (e.g., extra-level cells which can refer to cells operable at a level greater than SLCs, also referred to as non-SLC mode cells, where tri-level-cells (TLC) and quad-level-cells (QLC) are non-SLC mode cells). The number of physical blocks in the memory array can be 128 blocks, 512 blocks, or 1,024 blocks, but embodiments are not limited to a particular multiple of 128 or to any particular number of physical blocks in the memory array. Further, different portions of memory can serve as a dynamic SLC cache for media management operations, such as garbage collection. For example, different portions of memory can be dynamically increased and/or decreased in size as demands on the memory are increased and/or decreased to allow garbage collection to more efficiently address these demands.

Each physical block of the memory array can contain a number of physical rows of memory cells coupled to access lines (e.g., word lines). The number of rows (e.g., word lines) in each physical block can be 32, but embodiments are not limited to a particular number of rows per physical block. Further, the memory cells can be coupled to sense lines (e.g., data lines and/or digit lines).

Each row can include a number of pages of memory cells (e.g., physical pages). A physical page refers to a unit of programming and/or sensing (e.g., a number of memory cells that are programmed and/or sensed together as a functional group). Each row can comprise one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including XLCs, a physical page of memory cells can store multiple pages (e.g., logical pages) of data, for example, an upper page of data and a lower page of data, with each cell in a physical page storing one or more bits towards an upper page of data and one or more bits towards a lower page of data.

In a non-limiting example, an apparatus (e.g., the computing system 100) can include a memory sub-system touch-up component 113. The memory sub-system touch-up component 113 can be resident on the memory sub-system 110. As used herein, the term "resident on" refers to something that is physically located on a particular component. For example, the memory sub-system touch-up component 113 being "resident on" the memory sub-system 110 refers to a condition in which the hardware circuitry that comprises the memory sub-system touch-up component 113 is physically located on the memory sub-system 110. The term "resident on" can be used interchangeably with other terms such as "deployed on" or "located on," as referred to herein.

The memory sub-system touch-up component 113 can be configured to monitor mixed mode blocks. The memory sub-system touch-up component 113 can determine which block to write host data to next based on the monitored PEC of each of a number of mixed mode blocks, along with other parameters described below in association with FIGS. 3-4.

Figure 2:
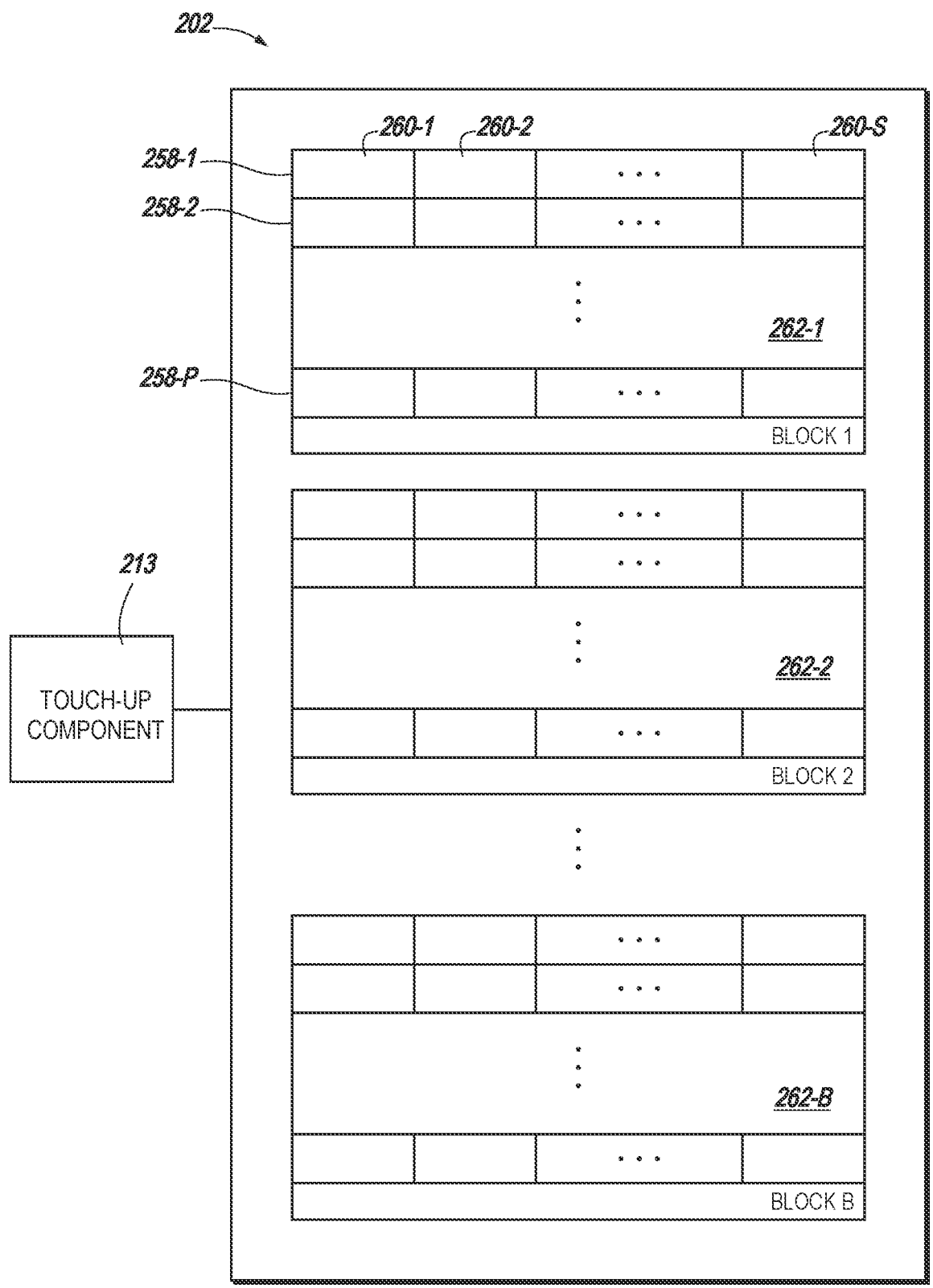
FIG. 2 illustrates an example of a non-volatile memory array for performing an SLC touch-up in accordance with some embodiments of the present disclosure.

FIG. 2 illustrates a diagram of a touch-up component 213 and a memory array 202 having physical blocks in accordance with some embodiments of the present disclosure. The touch-up component 213 (which can be similar to touch-up component 113 in FIG. 1) can be coupled to the memory array 202. The memory array 202 can represent a memory array of the non-volatile memory device 130 and/or the volatile memory device 140 in FIG. 1, for example. The memory array 202 can be, for example, a NAND flash memory array. As an additional example, memory array 202 can be a storage class memory (SCM) array, such as, for instance, a three-dimensional cross-point (3D Cross-point) memory array, a ferroelectric RAM (FRAM) array, or a resistance variable memory array such as a PCRAM, RRAM, or spin torque transfer (STT) array, among others. Further, although not shown in FIG. 2, memory array 202 can be located on a particular semiconductor die along with various peripheral circuitry associated with the operation thereof.

As shown in FIG. 2, the memory array 202 has a number of physical blocks 262-1 (BLOCK 1), 262-2 (BLOCK 2), . . . , 262-B (BLOCK B) of memory cells. The memory cells can be operated with various programming times and trims. A number of physical blocks 262 of memory cells can be included in a plane of memory cells, and a number of planes of memory cells can be included on a die. For instance, in the example shown in FIG. 2, each physical block 262 can be part of a single die. The portion of the memory array 202 illustrated in FIG. 2 can be a die of memory cells and/or a logical unit.

As shown in FIG. 2, each physical block 262 includes a number of physical rows (e.g., rows 258-1, 258-2, . . . , 258-P) of memory cells coupled to access lines (e.g., word lines). Further, although not shown in FIG. 2, the memory cells can be coupled to sense lines (e.g., data lines and/or digit lines). As one of ordinary skill in the art will appreciate, each row 258 can include a number of pages of memory cells (e.g., physical pages). A physical page refers to a unit of programming and/or sensing (e.g., a number of memory cells that are programmed and/or sensed together as a functional group). In the embodiment shown in FIG. 2, each row 258 comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple logical pages of data (e.g., an upper page of data and a lower page of data, with each cell in a physical page storing one or more bits towards an upper page of data and one or more bits towards a lower page of data).

As shown in FIG. 2, a row 258 of memory cells can comprise a number of physical sectors 260-1, 260-2, . . . , 260-S (e.g., subsets of memory cells). Each physical sector 260 of cells can store a number of logical sectors of data. Additionally, each logical sector of data can correspond to a portion of a particular page of data. As an example, one logical sector of data stored in a particular physical sector can correspond to a logical sector corresponding to one page of data, and the other logical sector of data stored in the particular physical sector can correspond to the other page of data. Each physical sector 260, can store system data, user data, and/or overhead data, such as error correction code (ECC) data, LBA data, and metadata.

Figure 3A:
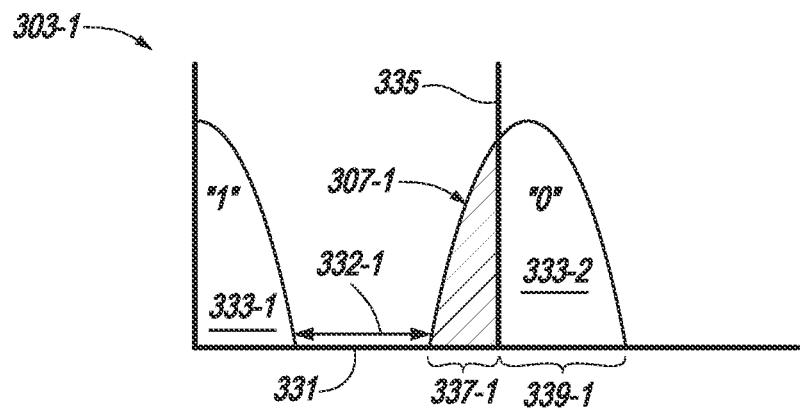
FIG. 3A illustrates example voltage distributions prior to performing a touch-up operation in accordance with some embodiments of the present disclosure.

FIG. 3A illustrates example voltage distributions 303-1 prior to performing a touch-up operation in accordance with some embodiments of the present disclosure. A voltage 331 is illustrated along the x-axis of the example voltage distributions 303-1. Voltage distribution 333-1 is associated with a bit value of "1" stored in a first plurality of memory cells and voltage distribution 333-2 is associated with a bit value of "0" stored in a second plurality of memory cells. The shaded portion 307-1 of voltage distribution 333-2 indicates memory cells that are below the threshold 335 used to demarcate whether the bit value is a "1," indicated by marker 337-1 (e.g., if the bit value is below the threshold) or a "0", indicated by marker 339-1 (if the bit value is above the threshold).

As illustrated in FIG. 3A, a distance 332-1 between voltage distributions 333-1 and 333-2 can be referred to as a valley 0 ("zero") margin. The distance 332-1 can have an affect on the ability to read data and the accuracy of the read data. In order to avoid errors when reading the data from a cell, a frequency of performance of a copyback frequency can be dynamic and can be based on a value of the distance 332-1. For example, in response to the distance 332-1 reaching a threshold distance (e.g., being less than a threshold distance), a copyback operation can be performed which can increase the distance 332-1. In some examples, the dynamic adjustment of the copyback operation frequency can be at a page or block level. In some examples, the dynamic adjustment of the copyback operation frequency can be based on a program/erase (P/E) cycle or other such factors.

Figure 3B:
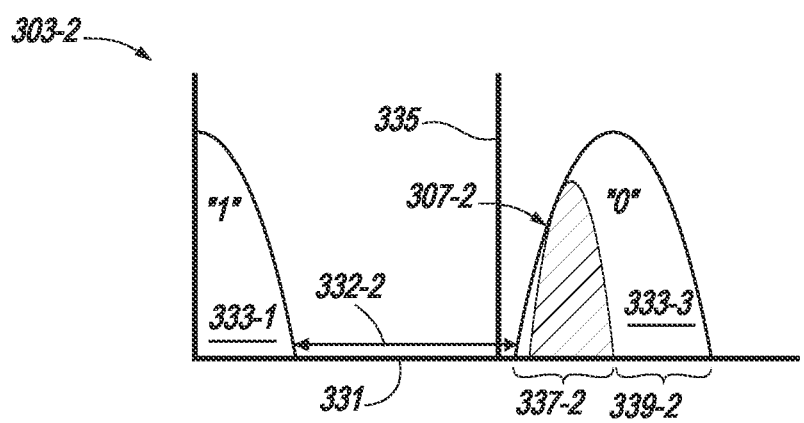
FIG. 3B illustrates example voltage distributions associated with performing a touch-up operation in accordance with some embodiments of the present disclosure.

FIG. 3B illustrates example voltage distributions 303-2 associated with performing a touch-up operation in accordance with some embodiments of the present disclosure. A voltage 331 is illustrated along the x-axis of the example voltage distributions 303-2. Voltage distribution 333-1 is associated with a bit value of "1" stored in the first plurality of memory cells and voltage distribution 333-3 is associated with a bit value of "0." The shaded portion 307-2 of voltage distribution 333-3 indicates memory cells that were below the threshold 335 prior to the touch-up operation (as illustrated in FIG. 3A as shaded portion 307-1) and, as illustrated in FIG. 3B, are now above the threshold 335 due to the touch-up operation. Marker 339-2 indicates the memory cells that were above the threshold both prior to and subsequent to performance of the touch-up operation.

As is illustrated in FIG. 3B, a margin distance (e.g., valley 0 margin distance) 332-2 can be greater than the margin distance 332-1 in FIG. 3A due to performance of the touch-up operation. For example, performing a touch-up operation can increase the margin distance and thereby reduce errors when reading out the data. In some examples, a touch-up operation can be performed on back-to-back pages where a hybrid approach of performing a touch-up operation with a copyback operation is performed the first time and an error correction operation is performed the second time to make sure that errors are not propagated.

Further, in some examples, a background scan can be used to determine if there is a high error rate and an error correction can be used as a fall-back instead of the copyback operation. For example, the raw data could be read out and checked for errors and then a determination can be made as to whether to use the copyback operation or if a write operation should be used to return the data to the memory. Further, several read strobes could be performed at difference voltages and an XOR operation can be performed on the data in order to count the number of bits that have changed to determine whether the read window budget margin has zero errors.

Figure 4:
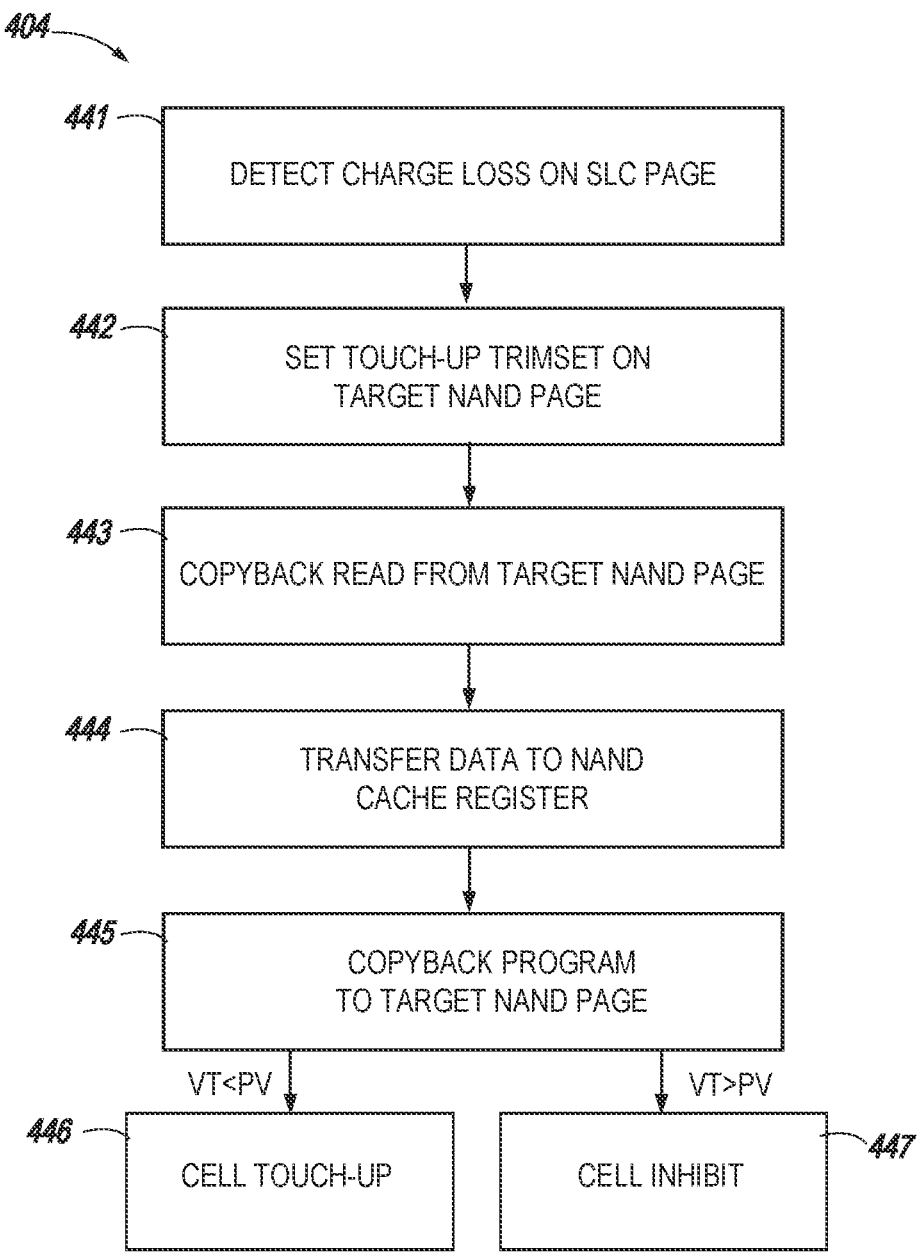
FIG. 4 illustrates an example flow diagram associated with performing a touch-up operation in accordance with some embodiments of the present disclosure.

FIG. 4 illustrates an example flow diagram 404 associated with performing a touch-up operation in accordance with some embodiments of the present disclosure. The method illustrated by flow diagram 404 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of flow diagram 404 is performed by the touch-up component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 441, a memory sub-system can detect charge loss on a single-level cell (SLC) page of memory cells. The page of memory cells can be NAND memory cells. The SLC page of memory cells can experience a loss of charge that lowers the charge of at least one of the memory cells of the page of memory cells below a threshold charge. In some embodiments the detection can be performed by a touch-up component (such as touch-up component 113 in FIG. 1).

At operation 442, the memory sub-system can set a touch-up trimset on a target NAND. Trimsets are sets of operating parameters, such as voltages, which can be used to operate memory cells. For example, the memory sub-system can determine a target NAND page of memory cells, such as the SLC page of memory cells that experienced a charge loss, to perform the set touch-up trimset on. At operation 443, the memory sub-system can perform a copyback read from the target NAND page. A copyback read refers to a read operation where data is read from one location in flash memory (and will be subsequently written to another location). The data that is read does not need to be sent to the host as the copyback read does not originate from a read request from the host. Further, the copyback read may not include performing error correction (e.g., not performing an ECC operation) on the data as it is not sent to the host. In some examples, the copyback read can be performed with a greater frequency to avoid using error correction. For example, over time, a charge loss can occur and if the frequency of the copyback read is increased, the time at which the charge loss could occur can be decreased. In some examples, the frequency of the copyback read operation can be based on a margin distance (e.g., a valley 0 margin distance, as described above).

However, while data in an SLC mode and stored in an SLC block may have a larger read window budget (RWB) and therefore be able to absorb a larger charge loss without running into errors (e.g., a data flip), data stored in TLC or QLC mode may use some error correction if the RWB associated with that data has a narrower RWB. It may still be possible and more valuable to implement a touch-up operation on data stored in TLC mode or QLC mode instead of performing SLC-to-SLC folding, but due to a narrower RWB for each level and a higher bit error count (BEC) compared to SLC touch-up, error correction may be used to correct the data prior to performing the page touch-up operation.

At operation 444, the memory sub-system transfers the data to a NAND cache register. The NAND cache register can be located in a memory array, such as in memory device 130, 140 in FIG. 1, or adjacent to the memory array. At operation 445, the memory sub-system performs a copyback program to the target NAND page. The copyback program can include programming the data that was stored into the NAND cache register back into the target NAND page. Therefore, in some examples, the copyback read and the copyback program may not include performing error correction, thereby reducing system resources. With the dynamic copyback program frequency adjustment, error correction can be avoided for a significant portion of the lifetime of the memory system.

At operation 446, in response to the voltage ("VT") of at least one memory cell in the target NAND page being below a program verify ("PV") value, a cell touch-up operation can be performed on the at least one memory cell. The cell touch-operation operation can include issuing a program pulse with a particular program voltage on the memory cells below the program verify value. Performing the program pulse on the memory cell results in an increased voltage in the memory cell and a subsequent passing of the program verify.

A program verify value is determined to perform a program verify operation. A program verify operation refers to a program check to determine whether a memory cell passes a program verify (e.g., whether the voltage value (or program verify value) of the memory cell is above a program verify value or, put another way, whether the voltage of the memory cell is above a threshold voltage). When memory cell voltage shifts down due to charge loss, the voltage of the memory cell fails the program verify.

At operation 447, in response to the VT of at least one memory cell in the target NAND page being above the PV, a cell inhibit can be performed on the at least one memory cell, as described above. In response to the voltage of the memory cell being above the threshold voltage, the memory cell can be inhibited. Inhibition of the memory cell refers to the memory cell being prevented from being affected by a program pulse intended to increase the voltage value of memory cells. As the voltage lowers, however, the inhibition of the memory cell can be removed.

Figure 5:
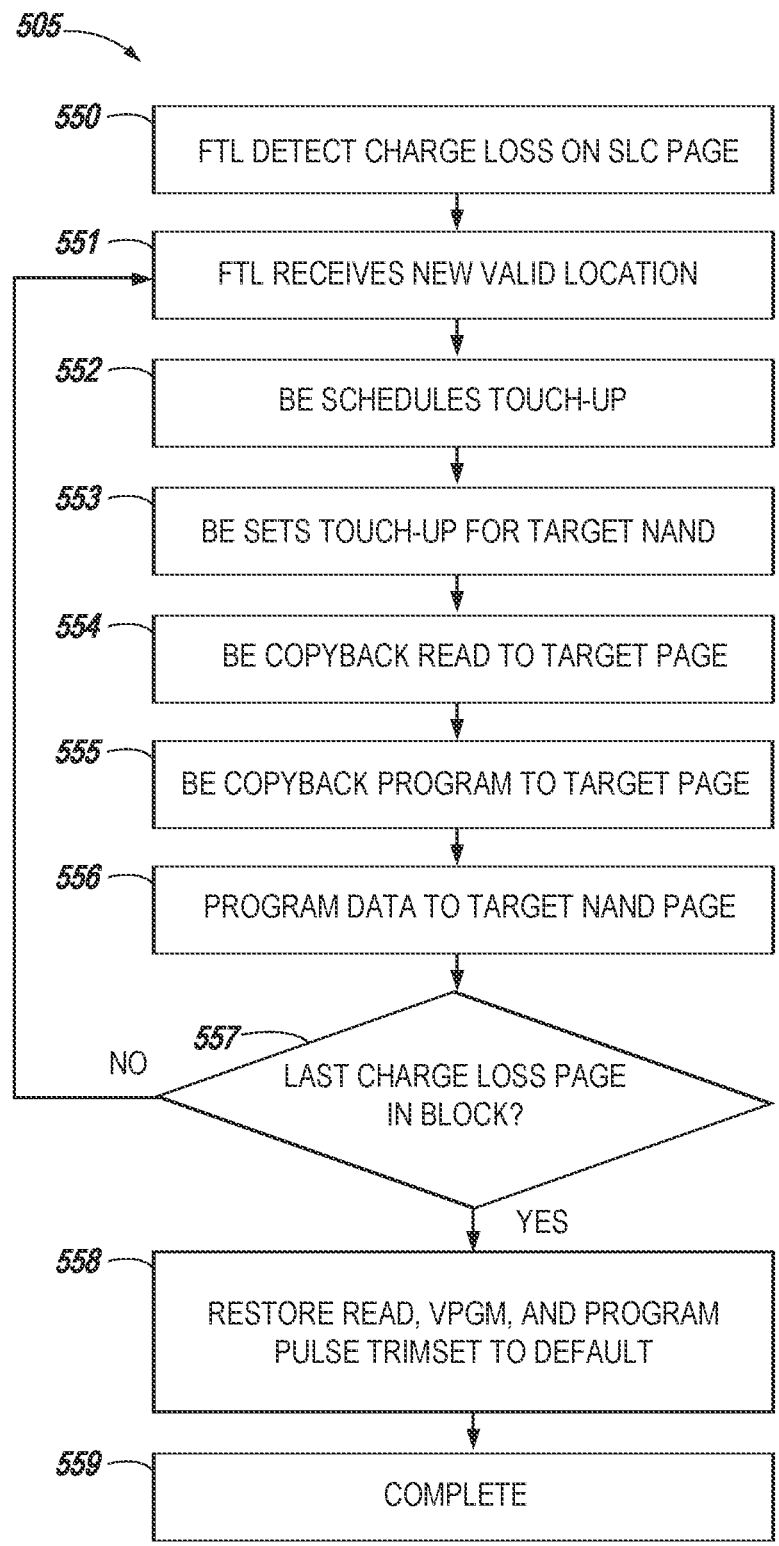
FIG. 5 illustrates an example flow diagram associated with performing a touch-up operation in accordance with some embodiments of the present disclosure.

FIG. 5 illustrates an example flow diagram associated with performing a touch-up operation in accordance with some embodiments of the present disclosure. The method illustrated by flow diagram 505 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of flow diagram 404 is performed by the touch-up component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 550, a flash translation layer (FTL) of a memory sub-system can be used to detect a charge loss on a single-level-cell (SLC) page. An FTL can be part of a flash memory controller and can be a layer below the file system that maps a hose side or file system logical block addresses (LBAs) to a physical address of a flash memory (e.g., logical-to-physical mapping). The mapping units of an FTL can differ such that LBAs are mapped block-, page-, or even sub-page-based.

At operation 551, the FTL can receive a new valid location from the block for performing a folding read operation. A folding operation refers to a process by which valid data is read from the memory device and rewritten to the memory device for purposes of storing the valid data together and freeing up memory space for new writes, to avoid errors in the data, and/or as part of an error recovery. Put another way, folding can be used to move or rewrite valid data to a new location for the purpose of error handling, error avoidance, and/or garbage collection. The new valid location can be a page of memory cells that includes at least one memory cell with charge loss. The page of memory cells can be from a particular block of memory. At operation 552, a backend portion ("BE") of a memory sub-system can schedule a touch-up operation. The touch-up operation can include performing a program pulse to increase a voltage of a memory cell that may have lost voltage due to charge loss where the voltage has decreased below a threshold. At operation 553, the backend portion can set a touch-up operation for a target NAND memory. The touch-up operation can be set with a touch-up trimset (e.g., read level, program voltage (VPGM), and program pulse, etc., related to trims) by determining what type of program pulse and which specific pages of NAND need to be touched up.

At operation 554, the backend portion can perform a copyback read operation to a target NAND page of the target NAND memory and store the data to the NAND cache register temporarily. A copyback read operation refers to a read operation where data is read from one location in flash memory (and will be subsequently written to another location, usually in the same logical unit number (LUN) but not limited to such examples). The data that is read does not need to be sent to the host as the copyback read does not originate from a read request from the host.

At operation 555, the backend portion can perform a copyback program operation on the target NAND page. The copyback program can include programming the data that was stored into the NAND cache register back into the target NAND page. At operation 556, the data can be programmed to the target NAND page. The programming of data can include a program pulse to increase the voltage of particular memory cells in the target NAND page.

At operation 557, a determination of whether a current page that was programmed is the last page with charge loss in the block can be performed. In response to the most recently programmed NAND page not being the last page with charge loss (e.g., "NO"), the FTL can receive a new valid location in the block that is the next page with charge loss and repeat the method for operation s 552 through 556, as described above. In response to the most recently programmed NAND page being the last page with charge loss in the block (e.g., "YES"), at operation 558, a restore operation for the touch-up trimset (e.g., read level, program voltage (VPGM), and program pulse, etc., related to trims) can be performed, and all of the trimsets can be set to default. At operation 559, a determination that the method has been completed can be determined.

Figure 6:
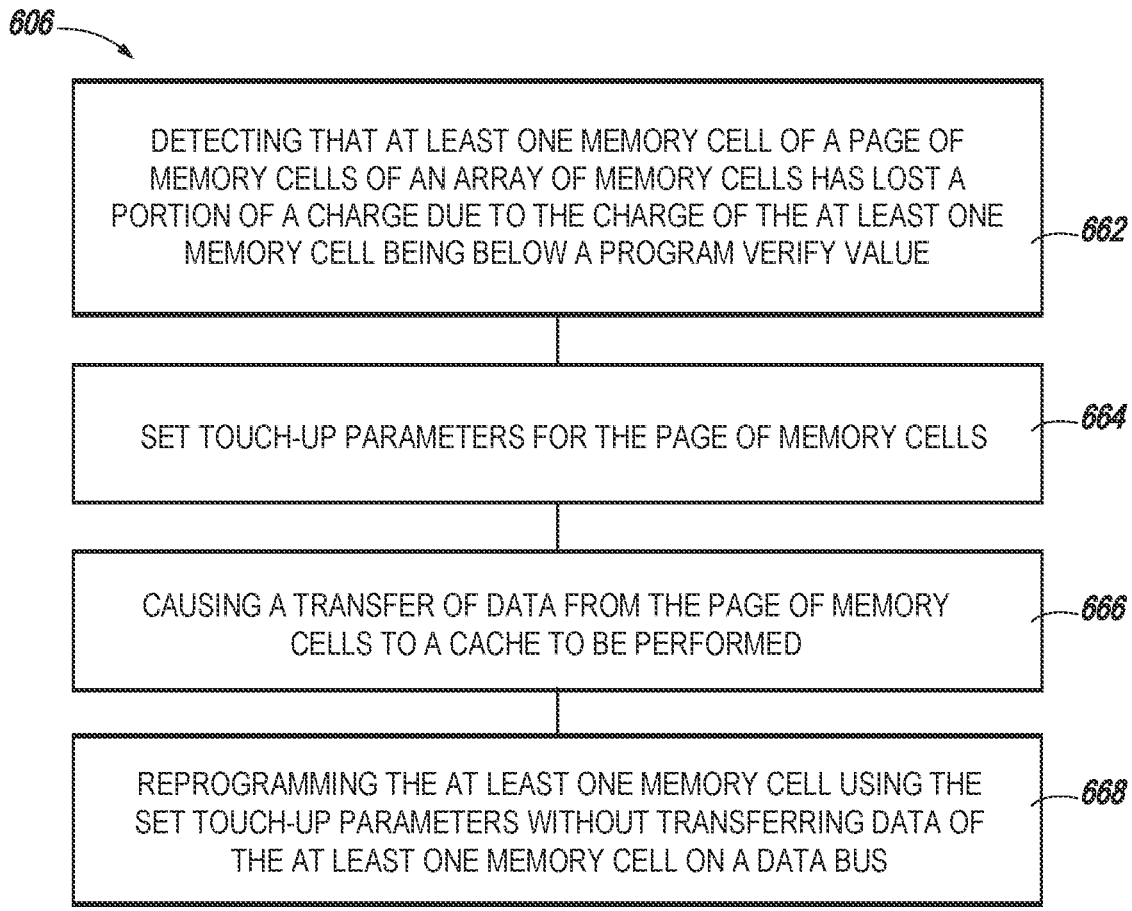
FIG. 6 illustrates an example method associated with performing a touch-up operation in accordance with some embodiments of the present disclosure.

FIG. 6 illustrates an example method associated with performing a touch-up operation in accordance with some embodiments of the present disclosure. The touch-up component can be analogous to the touch-up component 113 in FIG. 1. The method 606 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 606 is performed by the touch-up component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 662, at least one memory cell of a page of memory cells of an array of memory cells can be detected to have lost a portion of charge due to the charge of the at least one memory cell being below a program verify value. The method 606 can further include performing a program verify operation on each of the memory cells in the array of memory cells to determine whether a voltage in each of the memory cells is above or below a program verify voltage. The method 606 can further include repetitively performing the program verify operation on each of the memory cells to determine whether a voltage shift has occurred over a period of time.

At operation 664, touch-up parameters for the page of memory cells can be set. At operation 666, a transfer of data from the page of memory cells to a cache can be caused. The method 606 can further include transferring the data from the page of memory cells to the cache while not transferring the data from the inhibited at least one memory cell. In some embodiments, causing the transfer of data and reprogramming the at least one memory cell does not include transferring data on a data bus. In some embodiments, causing the transfer of data and reprogramming the at least one memory cell does not include performing an error correction operation. In some examples, the touch-up parameters can include a frequency of performing the reprogramming based on a margin distance being below a threshold margin distance. In some examples, the frequency of performing the reprogramming can be dynamically adjusted on a page basis. As an example, the frequency can be based on a page by page basis or adjusted per page rather than for all pages with the same frequency.

At operation 668, the at least one memory cell can be reprogrammed using the set touch-up parameters without transferring data of the at least one memory cell on a data bus. Reprogramming the at least one memory cell can include performing a pulse pattern on the data stored in the at least one memory cell. The method 606 can further include inhibiting at least one memory cell of the array of memory cells whose voltage is above a program verify value. The method 606 can further include avoiding transferring data from the inhibited at least one memory cell. The method 606 can further include reprogramming each of the memory cells with a voltage below the program verify voltage and inhibiting each of the memory cells with a voltage above the program verify voltage.

In summary, the method 606 illustrates how a memory sub-system can use a copyback read command with touch-up trimset for an associated target NAND page and NAND page data can be transferred from a memory array to a cache register for to perform a next copyback program operation. When a copyback program command is issued, the NAND can touch-up the target charge loss page. In this method, there is no data transfer on an ONFI bus for either of a read or write operation. In addition, there may be no extra overhead for an ECC engine of the memory sub-system controller for both read data decoding, error correction and write data encoding. The Flash Translation Layer (FTL) may only schedule a touch-up event with the target location to the backend (BE) portion and does not need to designate a new location for the touch-up page and update the FTL table. The BE can perform the entire touch-up process until no further touch-up request is received from the FTL and the FTL confirms all the charge loss pages in the block are touched up.

Figure 7:
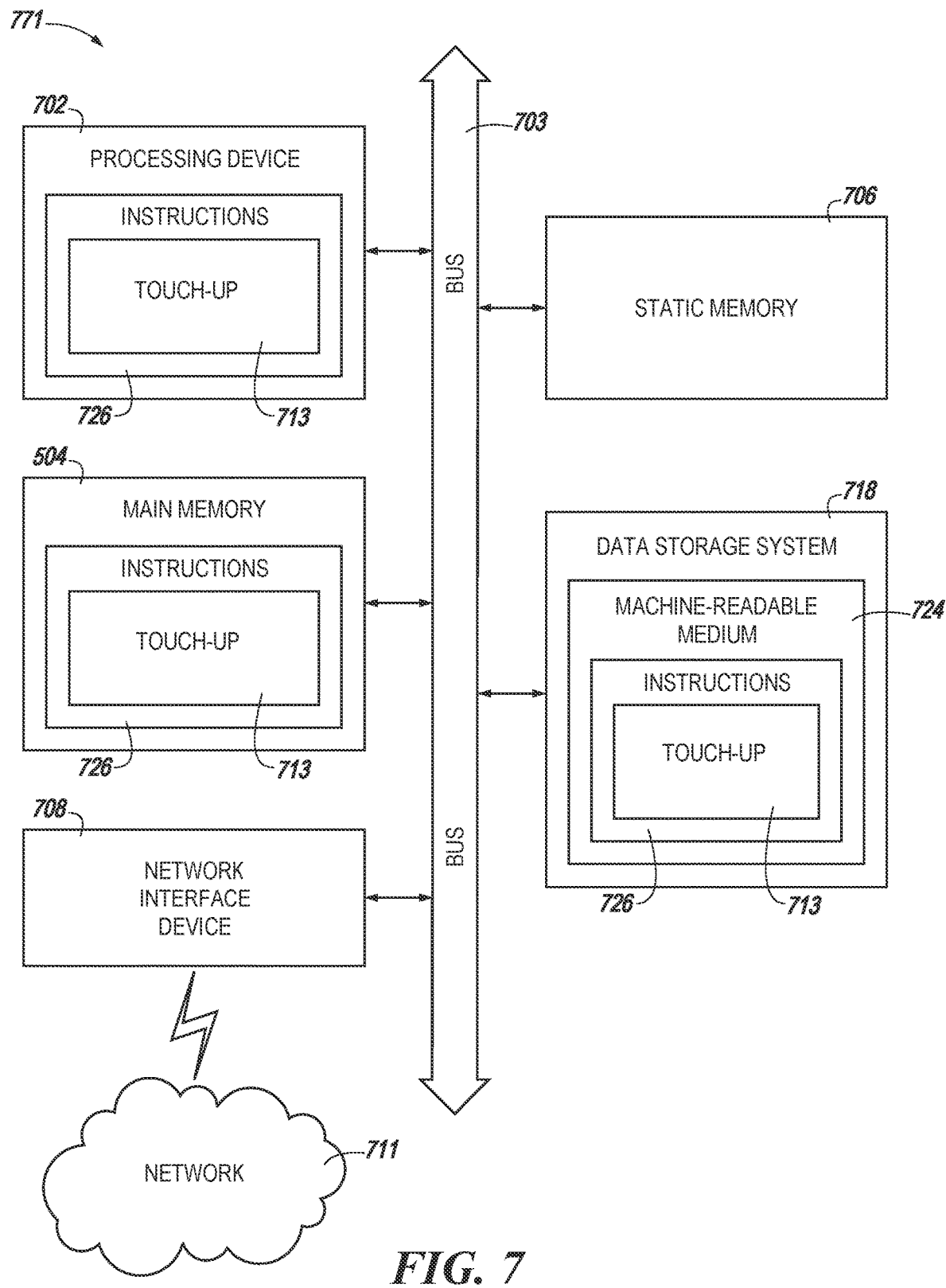
FIG. 7 is a block diagram of an example computer system in which embodiments of the present disclosure may operate.

FIG. 7 is a block diagram of an example computer system 771 in which embodiments of the present disclosure may operate. For example, FIG. 6 illustrates an example machine of a computer system 771 within which a set of instructions, for causing the machine to perform any one or more of the methodologies discussed herein, can be executed. In some embodiments, the computer system 771 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the touch-up component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 771 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 703.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 771 can further include a network interface device 708 to communicate over the network 711.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 771, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a touch-up component 713 (e.g., the touch-up component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 a touch-up component to perform operations comprising:
  detecting that at least one memory cell of a page of memory cells has lost a portion of a charge;
  setting touch-up parameters for the page of memory cells;
  causing a transfer of data from the page of memory cells to a cache; and
  reprogramming the at least one memory cell using the set touch-up parameters, wherein the touch-up parameters comprise a frequency of performing the reprogramming based on a margin distance being below a threshold margin distance.

2. The apparatus of claim 1, wherein the touch-up component is further configured to reprogram the at least one memory cell by, in response to the at least one memory cell losing the portion of the charge initially programmed to the at least one memory cell, reprogramming the at least one memory cell by performing a program pulse.

3. The apparatus of claim 1, wherein the touch-up component is further configured to inhibit at least one memory cell of the array of the page of memory cells whose voltage is above a program verify value.

4. The apparatus of claim 1, wherein the frequency of performing the reprogramming is dynamically adjusted on a page basis.

5. The apparatus of claim 1, wherein reprogramming the at least one memory cells comprises performing:
   a copyback operation; and
   subsequent to the copyback operation, a touch-up operation.

6. The apparatus of claim 1, wherein the at least one memory cell is reprogrammed without transferring the data on a bus to a host.

7. The apparatus of claim 6, wherein the reprogramming of the at least one memory cell without transferring the data on the bus is performed without transferring the data on the bus during both a write operation and a read operation.

8. The apparatus of claim 1, wherein the reprogramming of the at least one memory cell is performed independent of error correction operations.

9. The apparatus of claim 1, the touch-up component is further configured to reprogram the at least one memory cell without performing a single level cell-to-single level cell (SLC)-to-SLC folding operation.

10. The apparatus of claim 1, wherein the touch-up component is configured to perform the detection of the portion of the charge loss of the at least one memory cell by determining that a charge of the at least one memory cell is below a program verify value.

11. A method, comprising:
   detecting, via a touch-up component, that at least one memory cell of a page of memory cells of an array of memory cells has lost a portion of a charge due to the charge of the at least one memory cell being below a program verify value;
   setting touch-up parameters for the page of memory cells;
   causing a transfer of data from the page of memory cells to a cache;
   reprogramming the at least one memory cell using the set touch-up parameters without transferring data of the at least one memory cell on a data bus; and
   inhibiting at least one memory cell of the array of memory cells whose voltage is above the program verify value.

12. The method of claim 11, wherein the reprogramming is without performing a single level cell-to-single level cell (SLC)-to-SLC folding operation.

13. The method of claim 11, further comprising avoiding transferring data from the inhibited at least one memory cell.

14. The method of claim 11, further comprising transferring the data from the page of memory cells to the cache while not transferring the data from the inhibited at least one memory cell.

15. The method of claim 11, wherein reprogramming the at least one memory cell comprises performing a pulse pattern on the data stored in the at least one memory cell.

16. The method of claim 11, further comprising performing a program verify operation on each of the memory cells in the array of memory cells to determine whether a voltage in each of the memory cells is above or below the program verify voltage.

17. The method of claim 16, further comprising reprogramming each of the memory cells with a voltage below the program verify voltage and inhibiting each of the memory cells with a voltage above the program verify voltage.

18. The method of claim 16, comprising repetitively performing the program verify operation on each of the memory cells to determine whether a voltage shift has occurred over a period of time.

19. The method of claim 11, wherein causing the transfer of data and reprogramming the at least one memory cell does not include transferring data on a data bus to or from a host.

20. The method of claim 11, wherein causing the transfer of data and reprogramming the at least one memory cell does not include performing an error correction operation.

21. An apparatus, comprising:
   a memory device comprising a plurality of pages of memory; and
   a processing device coupled to the memory device, the processing device to perform operations comprising:
      performing a program verify operation on a plurality of memory cells in an array of memory cells, wherein the program verify operation indicates whether a voltage in a particular memory cell of the plurality of memory cells is below or equal to or exceeds a program verify voltage;
      in response to at least one memory cell of the plurality of memory cells with a voltage below a corresponding program verify voltage, detecting a margin distance of the at least one memory cell to be less than a threshold margin distance;
      setting touch-up parameters for the at least one memory cell;
      causing a transfer of data from the at least one memory cell to a cache; and
      reprogramming the at least one memory cell using the set touch-up parameters to increase the margin distance, wherein the increased margin distance reduces errors when reading out data from the plurality of memory cells.

22. The apparatus of claim 21, wherein reprogramming the at least one memory cell comprises performing a program pulse on the at least one memory cell until the voltage of the at least one memory cell exceeds the corresponding program verify voltage.

23. The apparatus of claim 21, wherein the processing device is to perform operations further comprising reprogramming the at least one memory cell without performing an error correction operation.

* * * * *